（12) United States Patent
Kobayashi et al.

(10) Patent No.: US 10,825,979 B2
(45) Date of Patent: Nov. 3, 2020

(54) PIEZOELECTRIC ELEMENT, PIEZOELECTRIC ACTUATOR, PIEZOELECTRIC MOTOR, ROBOT, ELECTRONIC COMPONENT TRANSPORTING APPARATUS, AND PRINTER

(71) Applicant: Seiko Epson Corporation, Tokyo (JP)

(72) Inventors: Tomokazu Kobayashi, Shiojiri (JP); Mitsumi Kishida, Shiojiri (JP); Tsutomu Asakawa, Shiojiri (JP)

(73) Assignee: Seiko Epson Corporation (JP)

(*) Notice: Subject to any disclaimer, the term of this patent is extended or adjusted under 35 U.S.C. 154(b) by 576 days.

(21) Appl. No.: 15/687,819

(22) Filed: Aug. 28, 2017

(65) Prior Publication Data
US 2018/0062064 A1    Mar. 1, 2018

(30) Foreign Application Priority Data
Aug. 31, 2016 (JP) ................. 2016-170175

(51) Int. Cl.
B25J 9/12       (2006.01)
H01L 41/083     (2006.01)
H01L 41/187     (2006.01)
H01L 41/27      (2013.01)
H01L 41/047     (2006.01)
H02N 2/00       (2006.01)
H01L 41/08      (2006.01)
H02N 2/10       (2006.01)
F04B 17/00      (2006.01)
F04B 43/09      (2006.01)

(52) U.S. Cl.
CPC ............ H01L 41/0475 (2013.01); B25J 9/12 (2013.01); F04B 17/003 (2013.01); F04B 43/095 (2013.01); H01L 41/0477 (2013.01); H01L 41/083 (2013.01); H01L 41/0805 (2013.01); H01L 41/187 (2013.01); H01L 41/27 (2013.01); H02N 2/004 (2013.01); H02N 2/103 (2013.01)

(58) Field of Classification Search
CPC .................................. H01L 41/075; B25J 9/12
See application file for complete search history.

(56) References Cited

U.S. PATENT DOCUMENTS 6,586,790 B2   7/2003  Kanaya et al.
6,705,708 B2   3/2004  Murai
(Continued)

FOREIGN PATENT DOCUMENTS

JP    2000-174228 A    6/2000
JP    2004-104066 A    4/2004
(Continued)

Primary Examiner — Thomas M Dougherty
Assistant Examiner — Karen B Addison
(74) Attorney, Agent, or Firm — Harness, Dickey & Pierce, P.L.C.

(57) ABSTRACT

A piezoelectric element includes: a substrate; a first electrode which is disposed on the substrate; a piezoelectric body layer which is disposed on the first electrode, which has a plurality of layers configured to contain a piezoelectric body material, and in which the total thickness of the plurality of layers is within a range of 1.6 μm to 10 μm; and an intermediate layer which is disposed on an interlayer of the piezoelectric body layer, and which is configured to contain titanium.

20 Claims, 17 Drawing Sheets

(56) References Cited

U.S. PATENT DOCUMENTS

| | | | |
|---|---|---|---|
| 6,883,901 B2* | 4/2005 | Murai | B41J 2/14233 |
| | | | 347/71 |
| 2009/0077782 A1 | 3/2009 | Takabe | |
| 2010/0225711 A1* | 9/2010 | Kato | H01L 41/0477 |
| | | | 310/364 |

FOREIGN PATENT DOCUMENTS

| | | |
|---|---|---|
| JP | 2006-144090 A | 6/2006 |
| JP | 4088817 B2 | 5/2008 |
| JP | 2009-076687 A | 4/2009 |
| JP | 2010-083120 A | 4/2010 |
| JP | 2010-201830 A | 9/2010 |
| JP | 2010-233337 A | 10/2010 |

* cited by examiner

PIEZOELECTRIC ELEMENT, PIEZOELECTRIC ACTUATOR, PIEZOELECTRIC MOTOR, ROBOT, ELECTRONIC COMPONENT TRANSPORTING APPARATUS, AND PRINTER

BACKGROUND

1. Technical Field

The present invention relates to a piezoelectric element, a piezoelectric actuator, a piezoelectric motor, a robot, an electronic component transporting apparatus, and a printer.

2. Related Art

In general, the piezoelectric element has a configuration in which a piezoelectric body is interposed between two electrodes. For example, in the piezoelectric element according to JP-A-2000-174228, a PZT film configured of lead zirconate titanate (PZT) is inserted between two Pt electrodes configured of platinum (Pt). In JP-A-2000-174228, when forming a PZT layer, by dividing the film into two layers, such as a first PZT film and a second PZT film, diffusion of Pt from the Pt electrode to the second PZT film is suppressed. Here, the first PZT film and the second PZT film are respectively formed by performing crystallization by heat treatment after depositing PZT using a sol-gel method or a sputtering method.

In recent years, a piezoelectric element in which the thickness thereof is thicker than that of the related art and hysteresis square-loop characteristics or piezoelectric characteristics are improved, has been required. However, in the configuration in which the PZT film is simply divided into two layers similar to the piezoelectric element according to JP-A-2000-174228, it cannot be said that the diffusion of Pt from the Pt electrode to the PZT film is sufficiently suppressed, and when the thickness is increased, there is a case where it is not possible to obtain a PZT film having a desirable orientation and it is not possible to sufficiently improve electric characteristics.

SUMMARY

An advantage of some aspects of the invention is to provide a piezoelectric element in which diffusion of electrode components to a piezoelectric body layer is sufficiently suppressed, electric characteristics are sufficiently improved, and the thickness of the piezoelectric element can be increased, and to provide a piezoelectric actuator, a piezoelectric motor, a robot, an electronic component transporting apparatus, and a printer which are provided with the piezoelectric element.

The advantage can be achieved by the following configurations.

A piezoelectric element according to an aspect of the invention includes: a substrate; a first electrode which is disposed on the substrate; a piezoelectric body layer which is disposed on the first electrode, which has a plurality of layers configured to contain a piezoelectric body material, and in which the total thickness of the plurality of layers is within a range of 1.6 µm to 10 µm; and an intermediate layer which is disposed on an interlayer of the piezoelectric body layer, and which is configured to contain titanium.

In the piezoelectric element, since the intermediate layer configured to contain titanium is disposed on the interlayer of the piezoelectric body layer, compared to a case where the piezoelectric body layer is simply divided into the plurality of layers, it is possible to reduce diffusion of electrode components of the first electrode into the piezoelectric body layer, and further, to improve an orientation ratio of the piezoelectric body material that configures the piezoelectric body layer. In addition, by setting the total thickness of the plurality of layers of the piezoelectric body layer to be within a range of 1.6 µm to 10 µm, it is possible to appropriately achieve an action of the intermediate layer as described above while increasing the thickness of the piezoelectric element. According to this, it is possible to sufficiently suppress the diffusion of the electrode components to the piezoelectric body layer, to sufficiently improve electric characteristics or piezoelectric characteristics, and to increase the thickness of the piezoelectric element.

In the piezoelectric element, it is preferable that the thickness of the intermediate layer is within a range of 2 nm to 6 nm.

With this configuration, the intermediate layer can appropriately achieve a function of reducing the diffusion of the electrode components of the first electrode into the piezoelectric body layer, and a function of increasing the orientation ratio of the piezoelectric body material that configures the piezoelectric body layer.

In the piezoelectric element, it is preferable that the intermediate layer is disposed on an interlayer positioned closest to the first electrode side among the interlayers of the plurality of layers of the piezoelectric body layer.

With this configuration, it is possible to decrease the thickness of the layer positioned closest to the first electrode side among the plurality of layers of the piezoelectric body layer, and to efficiently reduce the diffusion of the electrode components of the first electrode into the piezoelectric body layer by the intermediate layer. In addition, it is possible to simply regulate the distance between the intermediate layer and the first electrode with high accuracy in accordance with the thickness of the layer positioned closest to the first electrode side. By increasing the number of layers positioned on the second electrode side disposed on the piezoelectric body layer with respect to the intermediate layer among the plurality of layers of the piezoelectric body layer, it is possible to easily increase the thickness of the piezoelectric body layer.

In the piezoelectric element, it is preferable that the thickness of the layer positioned closest to the first electrode side among the plurality of layers of the piezoelectric body layer is within a range of 60 nm to 160 nm.

With this configuration, it is possible to efficiently reduce diffusion of the electrode components of the first electrode to the piezoelectric body layer.

In the piezoelectric element, it is preferable that the piezoelectric body material is lead zirconate titanate.

The lead zirconate titanate has a perovskite type crystal structure, and has excellent piezoelectric characteristics. Here, the piezoelectric body material having the perovskite type crystal structure can crystallize titanium contained in the intermediate layer as a crystal nucleus at a high orientation ratio. Therefore, it is possible to increase the orientation ratio of the layer positioned on the second electrode side with respect to the intermediate layer among the plurality of layers of the piezoelectric body layer.

A piezoelectric actuator according to another aspect of the invention includes the piezoelectric element according to the aspect of the invention.

In the piezoelectric actuator, it is possible to increase a driving force of the piezoelectric element.

A piezoelectric motor according to another aspect of the invention includes the piezoelectric element according to the aspect of the invention.

In the piezoelectric motor, it is possible to increase the driving force of the piezoelectric element.

A robot according to another aspect of the invention includes the piezoelectric element according to the aspect of the invention.

In the robot, it is possible to increase the driving force of the piezoelectric element.

An electronic component transporting apparatus according to another aspect of the invention includes the piezoelectric element according to the aspect of the invention.

In the electronic component transporting apparatus, it is possible to increase the driving force of the piezoelectric element.

A printer according to another aspect of the invention includes the piezoelectric element according to the aspect of the invention.

In the printer, it is possible to increase the driving force of the piezoelectric element.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, a piezoelectric element, a piezoelectric actuator, a piezoelectric motor, a robot, an electronic component transporting apparatus, and a printer according to the invention will be described in detail based on appropriate embodiments illustrated in the attached drawings.

1. Piezoelectric Actuator

First, an embodiment of the piezoelectric actuator according to the invention will be described.

First Embodiment

Figure 1:
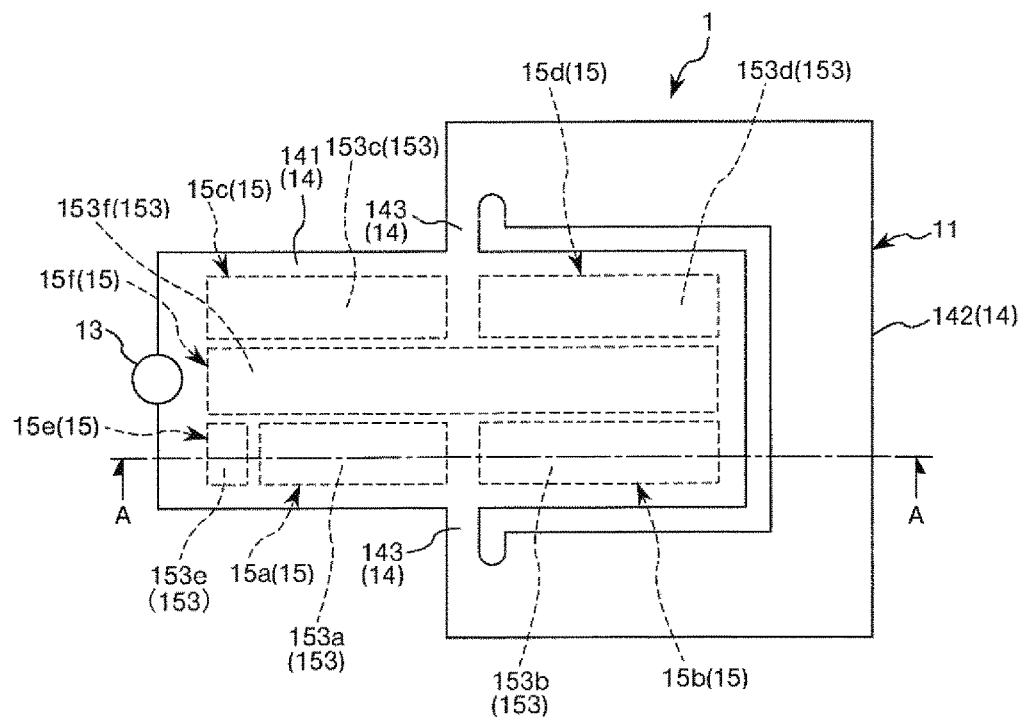
FIG. 1 is a plan view illustrating a piezoelectric actuator according to a first embodiment of the invention.
Figure 2:
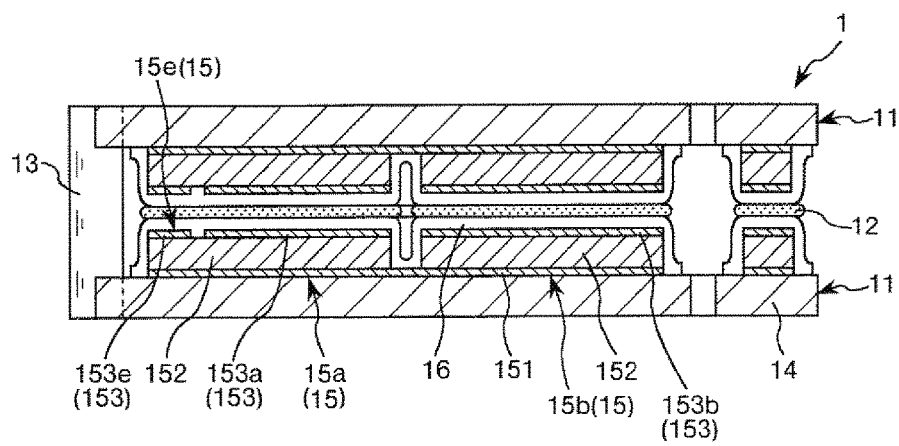
FIG. 2 is a sectional view taken along line A-A in FIG. 1.

FIG. 1 is a plan view illustrating the piezoelectric actuator according to a first embodiment of the invention. FIG. 2 is a sectional view taken along line A-A in FIG. 1. In addition, hereinafter, for convenience of the description, an upper side of FIG. 2 is referred to as "up", and a lower side is referred to as "down".

As illustrated in FIG. 2, a piezoelectric actuator 1 illustrated in FIG. 1 includes two piezoelectric element units 11, an adhesion layer 12 via which the two piezoelectric element units 11 are bonded to each other, and a projection member 13 which is provided across the two piezoelectric element units 11. Here, the two piezoelectric element units 11 are configured to be symmetric (vertically symmetric in FIG. 2) to the adhesion layer 12, and have configurations similar to each other.

Each of the piezoelectric element units 11 includes a substrate 14, a plurality of piezoelectric elements 15 provided on the substrate 14, and a protective layer 16 which covers the plurality of piezoelectric elements 15.

As illustrated in FIG. 1, the substrate 14 includes a driving portion 141, a fixing portion 142, and one pair of connection portions 143 connected to the driving portion 141 and the fixing portion 142. In the embodiment, the driving portion 141 has a rectangular shape when viewed in a plan view (hereinafter, simply referred to as a "plan view") in the thickness direction of the substrate 14. In addition, the fixing portion 142 is provided to be separated from the driving portion 141 along an outer circumference of a part on one end side in the longitudinal direction of the driving portion 141 in a plan view. In addition, the one pair of connection portions 143 is disposed on both sides in the width direction (direction orthogonal to the longitudinal direction) of the driving portion 141. In addition, the one pair of connection portions 143 connects the center portion in the longitudinal direction of the driving portion 141 and the fixing portion 142 to each other. In addition, when a desirable deformation or vibration of the driving portion 141 is possible, the shapes or the dispositions of the driving portion 141, the fixing portion 142, and the one pair of connection portions 143 are not limited to the description above. For example, the fixing portion 142 may be provided to be separated from each of the connection portions 143. In addition, the number, the shape, and the disposition of the connection portions 143 are also arbitrary.

The substrate 14 is, for example, a silicon substrate. In addition, although not being illustrated, an insulating layer is provided on a surface on the piezoelectric element 15 side of the substrate 14. Although not being particularly limited, for example, in a case where the substrate 14 is the silicon substrate, the insulating layer is a thermal oxide film (silicon dioxide film) which is formed by thermally oxidizing a surface of the silicon substrate and of which the thickness is approximately 1 μm. In addition, on the thermal oxide film, a $ZrO_2$ film may be provided. The $ZrO_2$ film can be formed by performing heat treatment with respect to a Zr film formed by a sputtering method or a vacuum deposition method in an oxygen atmosphere.

On the driving portion 141 of the substrate 14, the plurality of piezoelectric elements 15 are disposed. In the embodiment, the plurality of piezoelectric elements 15 are configured of five piezoelectric elements 15a, 15b, 15c, 15d, and 15f for driving, and one piezoelectric element 15e for detection.

The piezoelectric element 15f is disposed along the longitudinal direction of the driving portion 141 in the center portion in the width direction of the driving portion 141. The piezoelectric elements 15a and 15b are disposed on one side in the width direction of the driving portion 141 with respect to the piezoelectric element 15f, and the piezoelectric elements 15c and 15d are disposed on the other side. The piezoelectric elements 15a, 15b, 15c, and 15d are disposed corresponding to four regions divided along the longitudinal direction and the width direction of the driving portion 141. In addition, the piezoelectric element 15e is disposed on a side opposite to the piezoelectric element 15b with respect to the piezoelectric element 15a on one side in the width direction of the driving portion 141. In addition, not being limited to the disposition illustrated in the drawing, the piezoelectric element 15e can be omitted.

The piezoelectric elements 15a, 15b, 15c, 15d, 15e, and 15f which are disposed in this manner respectively include a first electrode 151 provided on the substrate 14, a piezoelectric body layer 152 provided on the first electrode 151, and a second electrode 153 provided on the piezoelectric body layer 152. Here, the first electrode 151 and the second electrode 153 are provided to interpose the piezoelectric body layer 152 therebetween in the thickness direction. In addition, the piezoelectric body layer 152 is configured to extend and contract in the direction along the longitudinal direction of the driving portion 141 as an electric field in the direction along the thickness direction of the piezoelectric body layer 152 is applied. In addition, regarding a layer configuration of each of the piezoelectric elements 15 (15a, 15b, 15c, 15d, 15e, and 15f) will be described later.

The first electrode 151 is a common electrode which is commonly provided in the piezoelectric elements 15a, 15b, 15c, 15d, 15e, and 15f. Meanwhile, the second electrodes 153 are individual electrodes which are individually provided for each of the piezoelectric elements 15a, 15b, 15c, 15d, 15e, and 15f. In the embodiment, the piezoelectric body layers 152 are individually provided for each of the piezoelectric elements 15a, 15b, 15c, 15d, and 15f, but are commonly provided for the piezoelectric elements 15a and 15e. In addition, the piezoelectric body layer 152 may be individually provided for each of the piezoelectric elements 15a and 15e, or may be commonly and integrally provided for the piezoelectric elements 15a, 15b, 15c, 15d, 15e, and 15f.

Here, the plurality of second electrodes 153 are configured of a second electrode 153a provided corresponding to the piezoelectric element 15a, a second electrode 153b provided corresponding to the piezoelectric element 15b, a second electrode 153c provided corresponding to the piezoelectric element 15c, a second electrode 153d provided corresponding to the piezoelectric element 15d, a second electrode 153e provided corresponding to the piezoelectric element 15e, and a second electrode 153f provided corresponding to the piezoelectric element 15f.

The second electrode 153a and the second electrode 153d are electrically connected to each other via a wiring which is not illustrated. Similarly, the second electrode 153b and the second electrode 153c are electrically connected to each other via a wiring which is not illustrated. In addition, an insulating film, such as a $SiO_2$ film which is not illustrated, is appropriately provided on the second electrode 153 or between the two wirings. In addition, the first electrode 151 is grounded (connected to a ground potential) via the wiring which is not illustrated. In addition, the first electrodes 151 of the two piezoelectric element units 11, the second electrodes 153a or the second electrodes 153d, the second electrodes 153b or the second electrodes 153c, and the second electrodes 153f, are respectively electrically connected to each other via a wiring which is not illustrated.

By the wiring, the piezoelectric elements 15a and 15d of the two piezoelectric element units 11 of the piezoelectric actuator 1 are electrically connected to each other in parallel. Similarly, the piezoelectric elements 15b and 15c of the two piezoelectric element units 11 of the piezoelectric actuator 1 are electrically connected to each other in parallel. In addition, the piezoelectric elements 15f of the two piezoelectric element units 11 of the piezoelectric actuator 1 are electrically connected to each other in parallel.

On the plurality of piezoelectric elements 15a, 15b, 15c, 15d, and 15e having the above-described configuration, a protective layer 16 is provided to collectively cover the plurality of piezoelectric elements 15a, 15b, 15c, 15d, and 15e. As a configuration material of the protective layer 16, for example, a silicone resin, an epoxy resin, or a polyimide resin can be used. In addition, the protective layer 16 can be formed, for example, by using a spin coating method.

In addition, a laminated body configured of the first electrode 151, the piezoelectric body layer 152, the second electrode 153, and the protective layer 16 as described above, is also disposed on the fixing portion 142 of the substrate 14. Accordingly, it is possible to stably bond the two piezoelectric element units 11 to each other via the adhesion layer 12.

The protective layers 16 of the two piezoelectric element units 11 having the above-described configuration are bonded to each other via the adhesion layer 12. An example of the adhesion layer 12 includes an epoxy resin.

In addition, the projection member 13 is fixed to an end portion opposite to the fixing portion 142 of the driving portion 141 of the two piezoelectric element units 11, for example, by an adhesive. In the embodiment, the projection member 13 has a cylindrical shape, and apart of the cylindrical surface is provided to protrude from the driving portion 141. It is preferable that the configuration material of the projection member 13 is a material having excellent wear resistance properties, and an example thereof includes ceramics. In addition, when a driving force can be transmitted to a driven portion, the shape thereof is not limited to the cylindrical shape.

In the piezoelectric actuator 1 configured as described above, a driving signal of which a voltage value regularly changes is input to the second electrode 153b by a driving circuit which is not illustrated. Then, each of the piezoelectric elements 15b and 15c repeatedly extends and contracts in the longitudinal direction of the driving portion 141. Accordingly, in accordance with bending vibration of the driving portion 141, the projection member 13 provided in one end portion in the longitudinal direction of the driving portion 141 reciprocates (vibrates) in the width direction of the driving portion 141. The driving force of the projection member 13 which vibrates in this manner is transmitted to the driven portion (for example, rotor) which is not illustrated. At this time, by inputting the driving signal synchronized with the piezoelectric elements 15b and 15c to the piezoelectric element 15f, it is possible to increase the driving force given to the driven portion from the projection member 13 and to control a track of the projection member 13. In addition, even when the driving signal of which the voltage value regularly changes is input to the second electrode 153d, similarly, by the driving of the piezoelectric elements 15a and 15d, it is possible to reciprocate (vibrate) the projection member 13 in the width direction of the driving portion 141. In this case, the driving signal may also be input to the second electrode 153b, and at this time, for example, a phase of the driving signal may be shifted by 180 degrees with respect to the phase of the driving signal input to the second electrode 153d.

Layer Configuration of Piezoelectric Element

Hereinafter, a layer configuration of the piezoelectric element 15 will be described.

Figure 3:
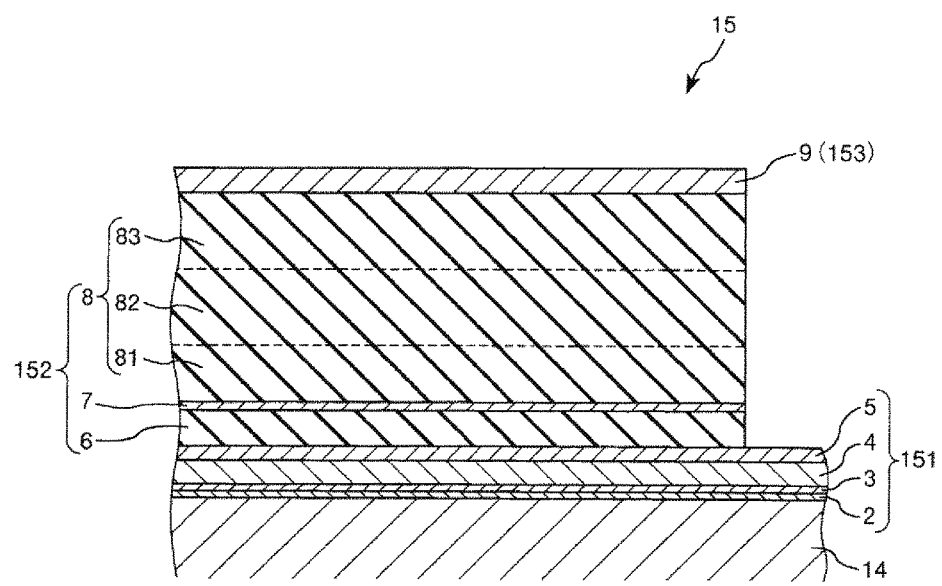
FIG. 3 is a partially enlarged sectional view of a piezoelectric element illustrated in FIG. 2.

FIG. 3 is a partially enlarged sectional view of the piezoelectric element illustrated in FIG. 2. In addition, hereinafter, for convenience of the description, an upper side in FIG. 3 is referred to as "upper", and a lower side is referred to as "down".

As illustrated in FIG. 3, the piezoelectric element 15 has a configuration in which a titanium layer 2, an iridium layer 3, a platinum layer 4, a titanium layer 5, a first piezoelectric body layer 6, an intermediate layer 7, a second piezoelectric body layer 8, and an iridium layer 9 are laminated in order on the substrate 14. Here, a laminated body configured of the titanium layer 2, the iridium layer 3, the platinum layer 4, and the titanium layer 5 configures the above-described first electrode 151. In addition, a laminated body configured of the first piezoelectric body layer 6, the intermediate layer 7, and the second piezoelectric body layer 8 configures the above-described piezoelectric body layer 152. In addition, the iridium layer 9 configures the above-described second electrode 153.

In other words, as described above, the piezoelectric element 15 includes the substrate 14, the first electrode 151 disposed on the substrate 14, the piezoelectric body layer 152 disposed on the first electrode 151, and the second electrode 153 disposed on the piezoelectric body layer 152.

In addition, the first electrode 151 has a configuration in which the titanium layer 2, the iridium layer 3, the platinum layer 4, and the titanium layer 5 are laminated in order from the substrate 14 side. In addition, the piezoelectric body layer 152 has a configuration in which the first piezoelectric body layer 6, the intermediate layer 7, and the second piezoelectric body layer 8 are laminated in order from the first electrode 151 side to the second electrode 153 side. In addition, the second electrode 153 is configured of the iridium layer 9. Here, although will be described later, the piezoelectric body layer 152 includes the first piezoelectric body layer 6 and the second piezoelectric body layer 8 (layers 81 to 83 which will be described later) as a "plurality of layers" configured to contain a piezoelectric body material, and the total thickness of the layers is within a range of 1.6 μm to 10 μm. In addition, the intermediate layer 7 provided in the piezoelectric element 15 is configured to be disposed in an interlayer of the piezoelectric body layer 152 and to contain titanium. In addition, the "plurality of layers" mean an aggregated body having a plurality of layers or a laminated body.

Hereinafter, each layer that configures the piezoelectric element 15 will be described in detail in order.

First and Second Electrodes

As described above, the first electrode 151 has a configuration in which the titanium layer 2, the iridium layer 3, the platinum layer 4, and the titanium layer 5 are laminated in order from the substrate 14 side.

The titanium layer 2 is configured of titanium (Ti). The titanium layer 2 has a function as an adhesive layer in which adhesiveness of the first electrode 151 with respect to the substrate 14 is improved. Here, the thickness of the titanium layer 2 is not particularly limited, but for example, is approximately 3 nm to 50 nm. In addition, instead of the titanium layer 2, a chrome layer configured of chrome may be used as the adhesive layer.

The iridium layer 3 is configured of iridium (Ir), and the platinum layer 4 is configured of platinum (Pt). Both of iridium and platinum are electrode materials having excellent conductivity, and chemical properties thereof are similar to each other. By providing the iridium layer 3 and the platinum layer 4, it is possible to achieve excellent characteristics as an electrode of the first electrode 151. Here, the thickness of the iridium layer 3 is not particularly limited, but for example, is approximately 4 nm to 20 nm. In addition, the thickness of the platinum layer 4 is not particularly limited, but for example, is approximately 50 nm to 200 nm.

In addition, any of the iridium layer 3 or the platinum layer 4 may be omitted, or a layer configured of iridium may further be provided on the side opposite to the iridium layer 3 with respect to the platinum layer 4. In addition, instead of the iridium layer 3 and the platinum layer 4, or in addition to the iridium layer 3 and the platinum layer 4, the layer configured of an electrode material other than iridium and platinum may be used. An example of the electrode material other than iridium and platinum includes a metal material, such as aluminum (Al), nickel (Ni), gold (Au), and copper (Cu), and one type thereof can be independently used or a combination of two or more types thereof can be used.

The titanium layer 5 is configured of titanium (Ti). The titanium layer 5 has a function of improving crystallinity (orientation) of the first piezoelectric body layer 6 as islet Ti becomes a crystal nucleus and the orientation of the first piezoelectric body layer 6 is controlled when forming the first piezoelectric body layer 6. Here, the thickness of the titanium layer 5 is not particularly limited, but for example, is approximately 3 nm to 20 nm.

Meanwhile, as described above, the second electrode 153 is configured of the iridium layer 9. The iridium layer 9 is configured of iridium (Ir). Here, the thickness of the iridium layer 9 is not particularly limited, but for example, is 15 nm to 70 nm. In addition, instead of the iridium layer 9 or in addition to the iridium layer 9, the second electrode 153 may use a layer configured of platinum. In addition, the second electrode 153 may use a layer configured of an electrode material other than iridium and platinum.

Piezoelectric Body Layer

As described above, the piezoelectric body layer 152 is inserted between the first electrode 151 and the second electrode 153 which are described above. In addition, the piezoelectric body layer 152 has a configuration in which the first piezoelectric body layer 6, the intermediate layer 7, and the second piezoelectric body layer 8 are laminated in order from the first electrode 151 side to the second electrode 153 side.

First and Second Piezoelectric Body Layers

The first and second piezoelectric body layers 6 and 8 are layers obtained by forming the piezoelectric body layer 152 by dividing the process into a plurality of times of film-forming and heat treatment. In this manner, by forming the piezoelectric body layer 152 by dividing the process into the plurality of times of film-forming and heat treatment, it is possible to reduce diffusion of electrode components of the first electrode 151 to the piezoelectric body layer 152. In the embodiment, the second piezoelectric body layer 8 has a configuration in which three layers 81, 82, and 83 are laminated. Accordingly, it becomes easy to increase the thickness of the second piezoelectric body layer 8. In addition, the second piezoelectric body layer 8 also efficiently contributes to reducing the diffusion of the electrode components of the first electrode 151 to the piezoelectric body layer 152. In addition, the number of layers that configure the second piezoelectric body layer 8 is not limited to that illustrated in the drawing, and may be two or four or more. In addition, the first piezoelectric body layer 6 may also be configured of a plurality of layers.

The first and second piezoelectric body layers 6 and 8 are configured of a piezoelectric ceramics material having a perovskite type crystal structure expressed by a general compositional formula $ABO_3$. Specifically, examples of the configuration materials of the first and second piezoelectric body layers 6 and 8 preferably include lead titanate ($PbTiO_3$), lead zirconate titanate ($Pb(Zr,Ti)O_3$), lead zirconate ($PbZrO_3$), lanthanum lead titanate (($Pb,La)TiO_3$), lead lanthanum zirconate titanate (($Pb,La)(Zr,Ti)O_3$), niobate lead zirconium titanate ($Pb(Zr,Ti,Nb)O_3$), and magnesium niobate lead zirconium titanate ($Pb(Zr,Ti)(Mg,Nb)O_3$). In particular, as the piezoelectric body material that configures the first and second piezoelectric body layers 6 and 8, lead zirconate titanate is preferable.

Here, the total thickness of the first piezoelectric body layer 6 and the second piezoelectric body layer 8 is within a range of 1.6 μm to 10 μm. Accordingly, the thick piezoelectric element 15 is obtained. In addition, since the thickness of the intermediate layer 7 which will be described later is substantially thinner compared to the thickness of the first piezoelectric body layer 6 or the second piezoelectric body layer 8, schematically, the thickness of the entire piezoelectric body layer 152 can be considered as the total thickness of the first piezoelectric body layer 6 and the second piezoelectric body layer 8.

In addition, the thickness of the first piezoelectric body layer 6 is thinner than the thickness of the second piezoelectric body layer 8, and more preferably, the thickness of the second piezoelectric body layer 8 is within a range of 0.01 times to 0.7 times. Accordingly, it is possible to efficiently reduce the diffusion of the electrode components of the first electrode 151 to the piezoelectric body layer 152, and to increase the thickness of the piezoelectric element 15.

The thickness of the layer positioned closest to the first electrode 151 side among the plurality of layers of the piezoelectric body layer 152, that is, a specific thickness of the first piezoelectric body layer 6, is preferably within a range of 60 nm to 160 nm, and is more preferably within a range of 80 nm to 130 nm. Accordingly, it is possible to efficiently reduce the diffusion of the electrode components of the first electrode 151 to the piezoelectric body layer 152. Meanwhile, when the thickness is extremely thin, when increasing the thickness of the piezoelectric body layer 152, the electrode components from the first electrode 151 is unlikely to be held within the first piezoelectric body layer 6, and the electrode components reach the second piezoelectric body layer 8, and as a result, a tendency that the range of diffusion of the electrode components of the first electrode 151 to the piezoelectric body layer 152 widens is shown. Meanwhile, even when the thickness is extremely small, a tendency that the range of diffusion of the electrode components of the first electrode 151 to the piezoelectric body layer 152 widens is shown.

Intermediate Layer

The intermediate layer 7 is inserted into an interlayer between the first piezoelectric body layer 6 and the second piezoelectric body layer 8 which are described above. The intermediate layer 7 is configured to contain titanium (Ti). The intermediate layer 7 has a function of dividing the piezoelectric body layer 152 into two layers, such as the first piezoelectric body layer 6 and the second piezoelectric body layer 8 as described above, and reducing the diffusion of the electrode components of the first electrode 151 to the piezoelectric body layer 152, and more specifically, a function of preventing movement of the electrode components of the first electrode 151 from the first piezoelectric body layer 6 to the second piezoelectric body layer 8 (function as a "diffusion preventing layer").

Here, the intermediate layer 7 is disposed on the interlayer positioned closest to the first electrode 151 side among the interlayers of the first piezoelectric body layer 6 and the second piezoelectric body layer 8 (layers 81 to 83) which are the "plurality of layers" that configure the piezoelectric body layer 152, that is, the interlayer of the first piezoelectric body layer 6 and the second piezoelectric body layer 8. Accordingly, it is possible to decrease the thickness of the layer (first piezoelectric body layer 6) positioned closest to the first electrode 151 side among the plurality of layers of the piezoelectric body layer 152, and to efficiently reduce the diffusion of the electrode components of the first electrode 151 into the piezoelectric body layer 152 by the interlayer 7. In addition, it is possible to simply regulate the distance between the intermediate layer 7 and the first electrode 151 with high accuracy in accordance with the thickness of the layer (first piezoelectric body layer 6) positioned closest to the first electrode 151 side. Therefore, it is advantageous that desirable characteristics of the piezoelectric element 15 can be easily obtained. In addition, by increasing the number of layers (layers 81 to 83) positioned on the second electrode 153 side with respect to the intermediate layer 7 among the plurality of layers of the piezoelectric body layer 152, it is possible to easily increase the thickness of the piezoelectric body layer 152.

In addition, the thickness of the intermediate layer 7 is preferably within a range of 2 nm to 6 nm, and is more preferably within a range of 3 nm to 5 nm. Accordingly, it is possible to appropriately achieve the above-described function of the intermediate layer 7, that is, the function of reducing the diffusion of the electrode components of the first electrode 151 into the piezoelectric body layer 152 (when the thickness is extremely thick, a voltage drop can occur due to the insertion of a layer having a low dielectric constant). Meanwhile, when the thickness is extremely thin, a tendency that the above-described action as the crystal nucleus becomes small is shown. Meanwhile, when the thickness is extremely thick, the first piezoelectric body layer 6 and the second piezoelectric body layer 8 are completely separated from each other considering the intermediate layer 7 as a boundary, and a tendency that the crystal between the first piezoelectric body layer 6 and the second piezoelectric body layer 8 becomes discontinuous and delamination is likely to occur, is shown.

Hereinafter, actions and effects of the intermediate layer 7 will be described. In addition, hereinafter, a case where the lead zirconate titanate (PZT) is used as the configuration material of the first piezoelectric body layer 6 and the second piezoelectric body layer 8 will be described.

Diffusion Reduction of Electrode Components

Figure 4:
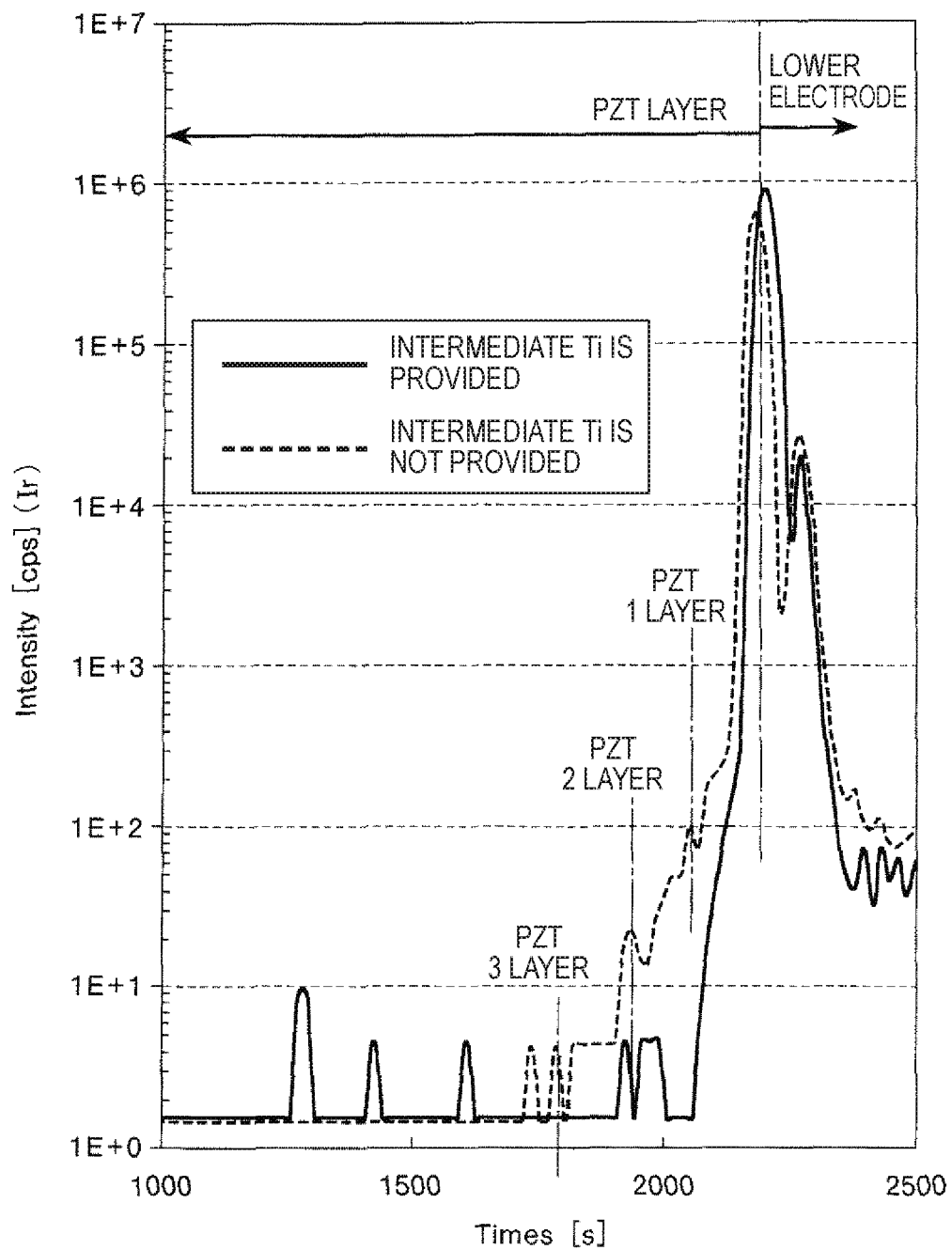
FIG. 4 is a graph illustrating a result of analyzing a diffused state of first electrode components to a piezoelectric body layer with respect to each of a case where an intermediate layer is provided and a case where an intermediate layer is not provided, using a secondary ion mass spectrometry.
Figure 5:
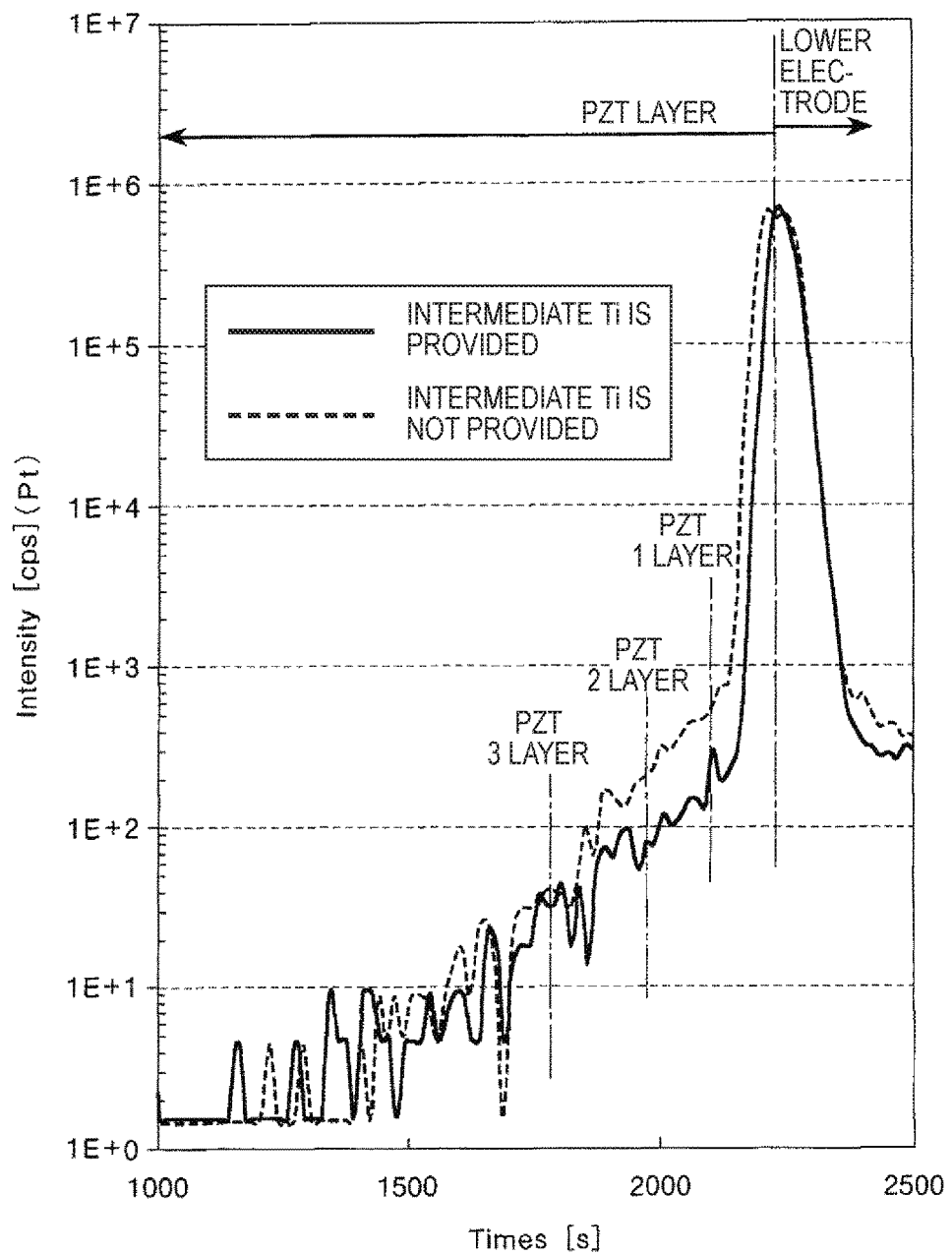
FIG. 5 is a graph illustrating a result of analyzing a diffused state of first electrode components to the piezoelectric body layer with respect to each of the case where the intermediate layer is provided and the case where the intermediate layer is not provided, using the secondary ion mass spectrometry.

FIG. 4 is a graph illustrating a result of analyzing a diffused state of first electrode components (Ir) to the piezoelectric body layer with respect to each of a case where the intermediate layer is provided and a case where the intermediate layer is not provided, using a secondary ion mass spectrometry. FIG. 5 is a graph illustrating a result of analyzing a diffused state of first electrode components (Pt) to the piezoelectric body layer with respect to each of the case where the intermediate layer is provided and the case where the intermediate layer is not provided, using the secondary ion mass spectrometry.

In a case where the intermediate layer 7 (thickness is 4 nm) is provided (illustrated by a solid line in FIG. 4), compared to a case where the intermediate layer 7 is not provided (illustrated by a dotted line in FIG. 4), the diffusion of iridium (Ir) which is the electrode component of the first electrode 151 into the piezoelectric body layer 152 is reduced. Similarly, in a case where the intermediate layer 7 (thickness is 4 nm) illustrated by a solid line in FIG. 5 is provided, compared to a case where the intermediate layer 7 is not provided illustrated by a solid line in FIG. 5, the diffusion of gold (Pt) which is the electrode component of the first electrode 151 to the piezoelectric body layer 152 is reduced.

In addition, horizontal axes (Times) in FIGS. 4 and 5 correspond to the position in the thickness direction of the piezoelectric element 15, and vertical axes (Intensity) correspond to the amount of the electrode components. In addition, in FIGS. 4 and 5, a "lower electrode" indicates the first electrode 151, and a "PZT layer" indicates the piezoelectric body layer 152. In addition, regarding one-dot chain lines in FIGS. 4 and 5, "PZT1 layer" indicates a boundary portion (position of the intermediate layer 7) between the first piezoelectric body layer 6 and the second piezoelectric body layer 8, "PZT2 layer" indicates a boundary portion between the layer 81 and the layer 82 in the second piezoelectric body layer 8, and "PZT3 layer" indicates a boundary portion between the layer 82 and the layer 83 of the second piezoelectric body layer 8.

Improvement of Orientation Ratio of Piezoelectric Body Layer

Figure 6:
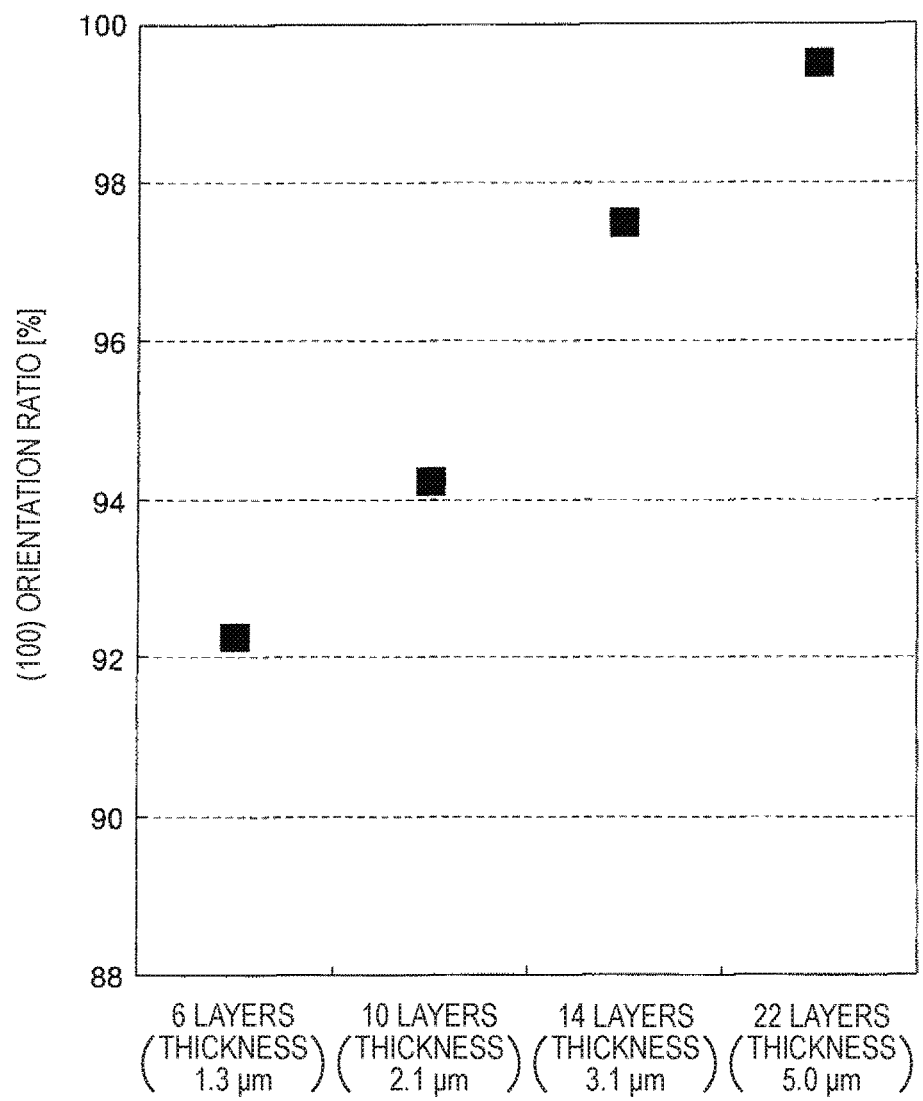
FIG. 6 is a graph illustrating a relationship between a thickness of the piezoelectric body layer of piezoelectric elements of a layer configuration illustrated in FIG. 3 and an orientation ratio.

FIG. 6 is a graph illustrating a relationship between the thickness of the piezoelectric body layer of the piezoelectric elements of the layer configuration illustrated in FIG. 3 and the orientation ratio.

In the piezoelectric element 15 of the intermediate layer 7, as illustrated in FIG. 6, it is possible to increase the orientation ratio of the piezoelectric body that configures the piezoelectric body layer 152. In addition, as the thickness of the piezoelectric body layer 152 increases, it is possible to increase the orientation ratio of the piezoelectric body that configures the piezoelectric body layer 152.

In addition, the result illustrated in FIG. 6 is a result of measuring the orientation ratio (degree of orientation in a plane 100) of the piezoelectric body that configures the piezoelectric body layer 152 by an X-ray diffraction wide-angle method, with respect to each of the plurality of piezoelectric elements 15 having different thicknesses of the second piezoelectric body layer 8. In addition, a horizontal axis in FIG. 6 is the number of layers configured of the piezoelectric body in the piezoelectric body layer 152, and a vertical axis is the orientation ratio of the piezoelectric body that configures the piezoelectric body layer 152. Here, the "number of layers configured of the piezoelectric body in the piezoelectric body layer 152" is the total number of layers that configure the first piezoelectric body layer 6 and the layers that configure the second piezoelectric body layer 8 (for example, in a case illustrated in FIG. 3, 4 layers). In addition, in the horizontal axis in FIG. 6, the thicknesses of the piezoelectric body layer 152 which corresponds to the number of layers configured of the piezoelectric body in the piezoelectric body layer 152 are additionally written.

Current and Voltage Characteristics

Figure 7:
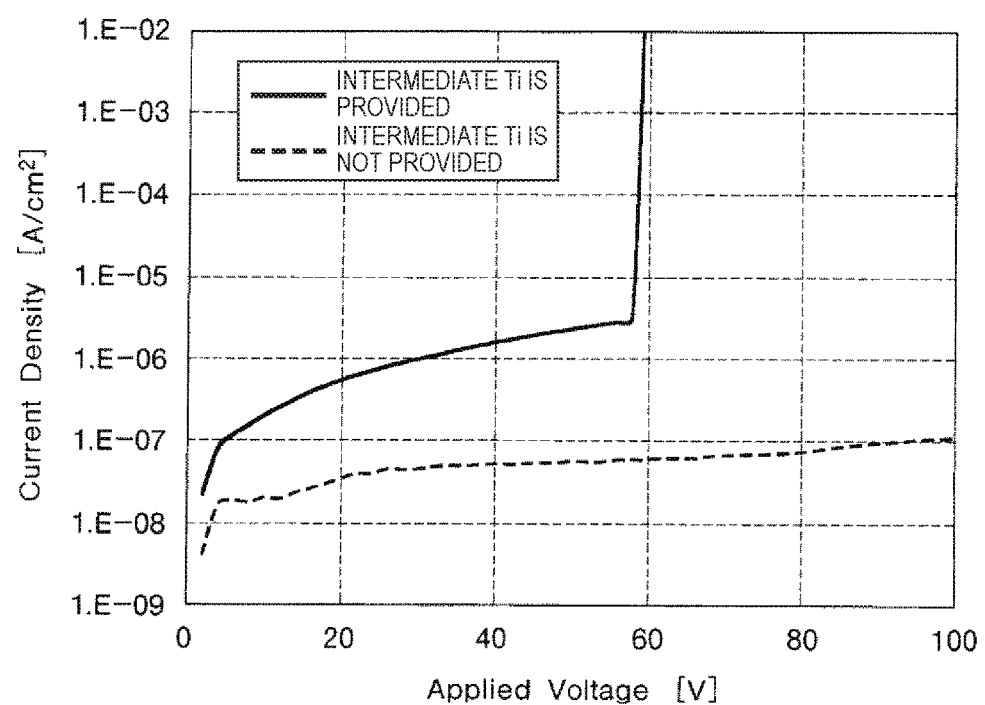
FIG. 7 is a graph illustrating a relationship between a voltage applied to the piezoelectric elements and a current with respect to each of the case where the intermediate layer is provided and the case where the intermediate layer is not provided.

FIG. 7 is a graph illustrating a relationship between a voltage applied to the piezoelectric elements and a current with respect to each of the case where the intermediate layer is provided and the case where the intermediate layer is not provided.

In a case where the intermediate layer 7 (thickness is 4 nm) is provided (illustrated by a solid line in FIG. 7), compared to a case where the intermediate layer 7 is not provided (illustrated by a broken line in FIG. 7), it is possible to reduce a leakage current by one order or more, and to improve voltage endurance properties. In addition, the result illustrated in FIG. 7 is a result of measuring the current that flows to the piezoelectric element 15 when changing the voltage applied to the piezoelectric element 15.

Hysteresis Square-Loop Characteristics

Figure 8:
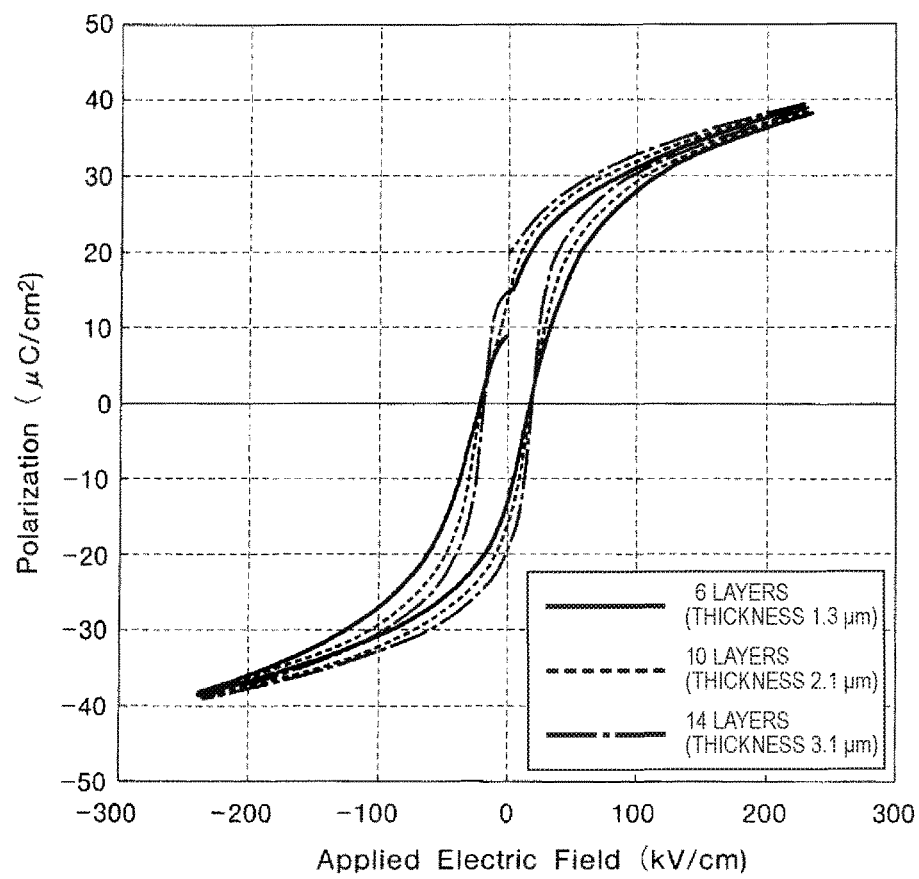
FIG. 8 is a graph illustrating a relationship (hysteresis square-loop characteristics) between electric fields for each thickness of the piezoelectric body layer of the piezoelectric elements of the layer configuration illustrated in FIG. 3 and a dielectric polarization.

FIG. 8 is a graph illustrating a relationship (hysteresis square-loop characteristics) between electric fields for each thickness of the piezoelectric body layer of the piezoelectric elements of the layer configuration illustrated in FIG. 3 and a dielectric polarization.

In the piezoelectric element 15 of the intermediate layer 7, as illustrated in FIG. 8, as the thickness of the piezoelectric body layer 152 increases, the hysteresis square-loop characteristics of the piezoelectric body layer 152 can be improved. In addition, as the thickness of the piezoelectric body layer 152 increases, it is possible to efficiently reduce voltage drop with respect to the piezoelectric body layer 152. In addition, the result illustrated in FIG. 8 is a result of performing measurement with respect to each of the three piezoelectric elements 15 of which the thicknesses of the piezoelectric body layer 152 are respectively 1.3 µm, 2.1 µm, and 3.1 µm. Here, the number of layers configured of the piezoelectric body in the piezoelectric body layer 152 is 6 in a case where the thickness of the piezoelectric body layer 152 is 1.3 μm, 10 in a case where the thickness is 2.1 μm, and 14 in a case where the thickness is 3.1 μm.

Piezoelectric Characteristics

Figure 9:
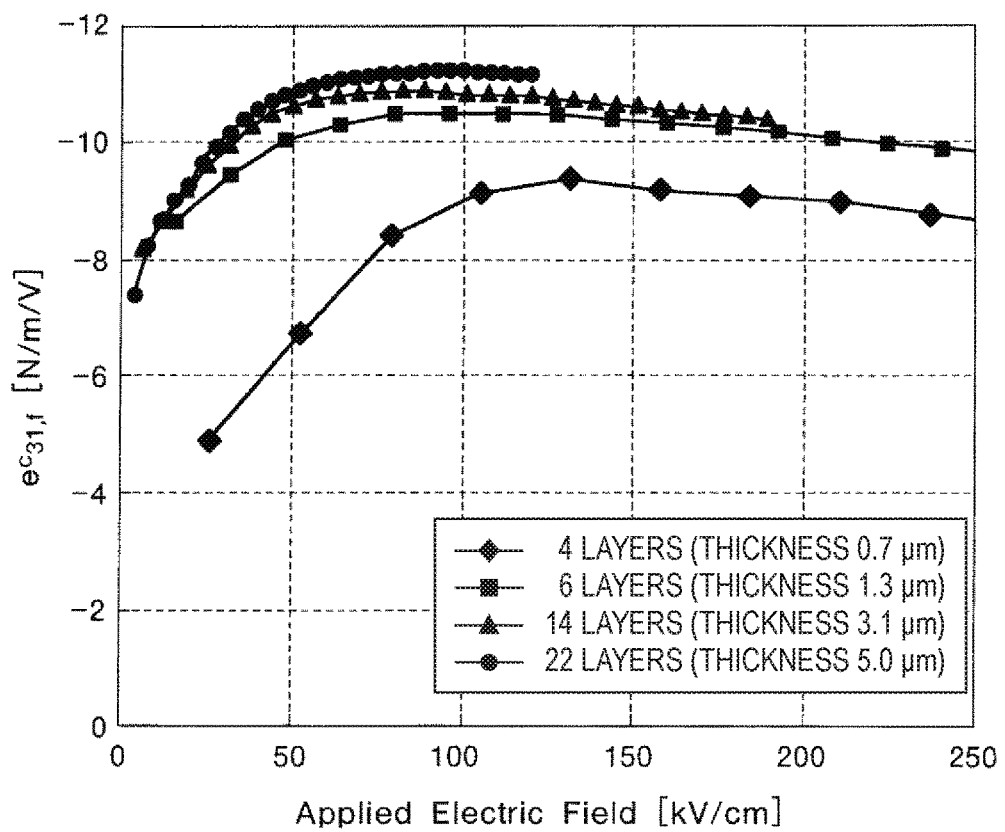
FIG. 9 is a graph illustrating a relationship between the electric fields for each thickness of the piezoelectric body layer of the piezoelectric elements of the layer configuration illustrated in FIG. 3 and a piezoelectric stress constant.

FIG. 9 is a graph illustrating a relationship between the electric fields for each thickness of the piezoelectric body layer of the piezoelectric elements of the layer configuration illustrated in FIG. 3 and a piezoelectric stress constant (e31).

In the piezoelectric element 15 of the intermediate layer 7, as illustrated in FIG. 9, as the thickness of the piezoelectric body layer 152 increases, it is possible to efficiently reduce voltage drop with respect to the piezoelectric body layer 152, and to improve the piezoelectric characteristics. In addition, the result illustrated in FIG. 8 is a result of calculation based on the shape and the dimension of the piezoelectric element 15 and physical properties of the substrate 14 as a result of creating a cantilever type sample and measuring a displacement amount with respect to the electric field by using a laser displacement meter, with respect to each of the four piezoelectric elements 15 when the thicknesses of the piezoelectric body layer 152 are respectively 0.7 μm, 1.3 μm, 3.1 μm, and 5.0 μm. Here, the number of layers configured of the piezoelectric body in the piezoelectric body layer 152 is 4 in a case where the thickness of the piezoelectric body layer 152 is 0.7 μm, 6 in a case where the thickness is 1.3 μm, 14 in a case where the thickness is 3.1 μm, and 22 in a case where the thickness is 5.0 μm.

According to the piezoelectric element 15 described above, since the intermediate layer 7 configured to contain titanium is disposed on the interlayer of the piezoelectric body layer 152, compared to a case where the piezoelectric body layer 152 is simply divided into a plurality of layers, it is possible to reduce the diffusion of the electrode components of the first electrode 151 into the piezoelectric body layer 152, and further, to increase the orientation ratio of the piezoelectric body material that configures the piezoelectric body layer 152. In addition, by setting the total thickness of the plurality of layers of the piezoelectric body layer 152 to be within a range of 1.6 μm 10 μm, it is possible to increase the thickness of the piezoelectric element 15, and to appropriately achieve the action of the intermediate layer 7 as described above. According to this, it is possible to sufficiently suppress the diffusion of the electrode components to the piezoelectric body layer 152, to sufficiently improve electric characteristics, and to increase the thickness of the piezoelectric element 15.

In addition, since the piezoelectric actuator 1 includes the piezoelectric element 15 that achieves the above-described effects, it is possible to increase the driving force of the piezoelectric element 15.

Manufacturing Method of Piezoelectric Actuator

Hereinafter, a manufacturing method of the piezoelectric actuator 1 will be described.

Figure 10:
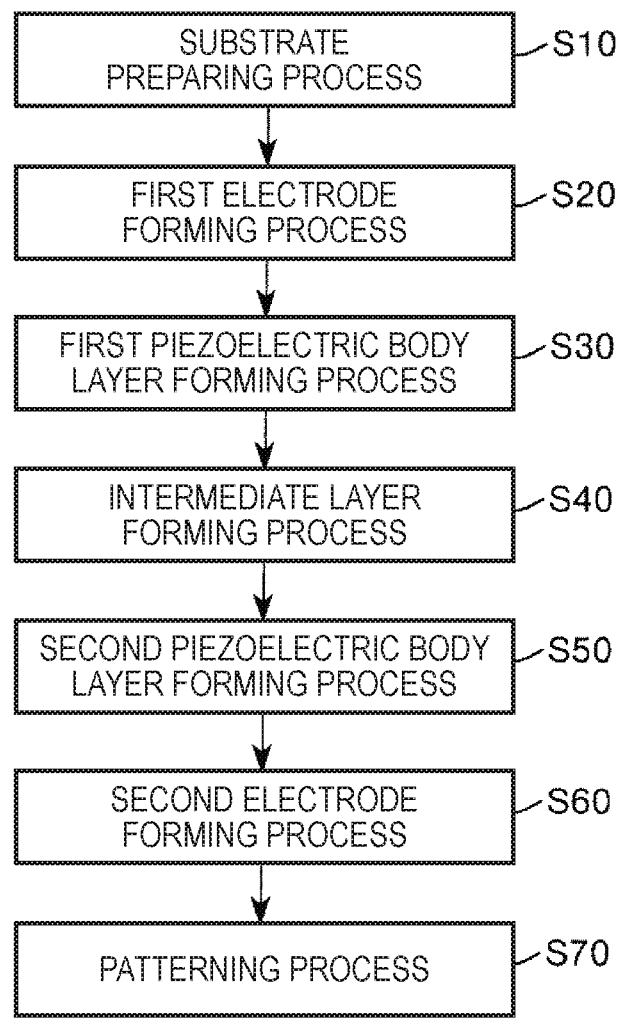
FIG. 10 is a flowchart describing a manufacturing method of the piezoelectric element of the layer configuration illustrated in FIG. 3.

FIG. 10 is a flowchart describing a manufacturing method of the piezoelectric elements of the layer configuration illustrated in FIG. 3.

As illustrated in FIG. 10, the manufacturing method of the piezoelectric actuator 1 includes [1] a substrate preparing process S10, [2] a first electrode forming process S20, [3] a first piezoelectric body layer forming process S30, [4] an intermediate layer forming process S40, [5] a second piezoelectric body layer forming process S50, [6] a second electrode forming process S60, and [7] a patterning process S70. Hereinafter, each process will be briefly described in order.

[1] Substrate Preparing Process S10

Figure 11:
FIG. 11 is a view describing a substrate preparing process illustrated in FIG. 10.

FIG. 11 is a view describing the substrate preparing process illustrated in FIG. 10.

First, as illustrated in FIG. 11, the substrate 14 is prepared. The substrate 14 is obtained, for example, by preparing a silicon substrate, and by forming a silicon oxide film by thermal oxidation with respect to one surface of the silicon substrate. In addition, on the silicon oxide film, a $ZrO_2$ film may also be formed using a sputtering method or a vacuum deposition method.

[2] First Electrode Forming Process S20

Figure 12:
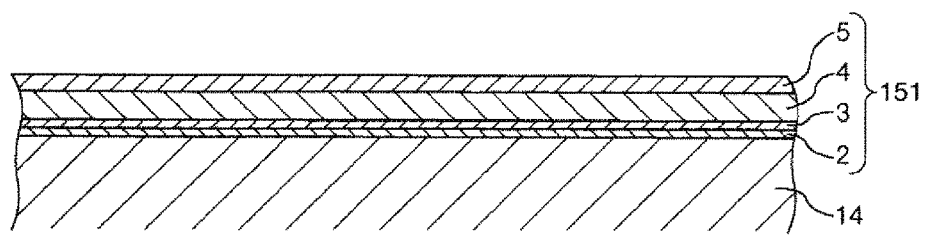
FIG. 12 is a view describing a first electrode forming process illustrated in FIG. 10.

FIG. 12 is a view describing the first electrode forming process illustrated in FIG. 10.

Next, as illustrated in FIG. 12, on one surface of the substrate 14, the titanium layer 2, the iridium layer 3, the platinum layer 4, and the titanium layer 5 are formed in order, and the first electrode 151 is formed. Here, the titanium layer 2, the iridium layer 3, the platinum layer 4, and the titanium layer 5 are respectively formed, for example, using the sputtering method.

[3] First Piezoelectric Body Layer Forming Process S30

Figures 13, 14, 15:
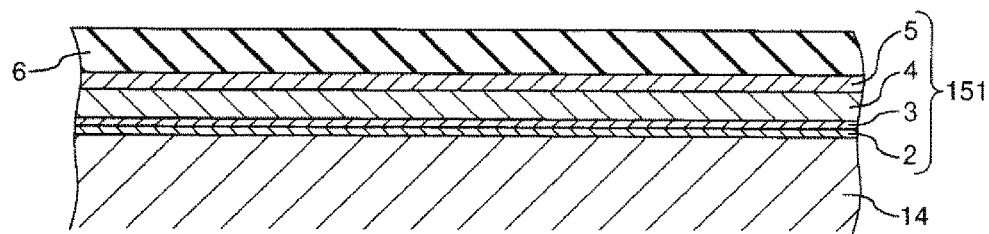
FIG. 13 is a view describing a first piezoelectric body layer forming process illustrated in FIG. 10.
FIG. 14 is a view describing an intermediate layer forming process illustrated in FIG. 10.
FIG. 15 is a view describing a second piezoelectric body layer forming process illustrated in FIG. 10.

FIG. 13 is a view describing the first piezoelectric body layer forming process illustrated in FIG. 10.

Next, as illustrated in FIG. 13, on the first electrode 151, the first piezoelectric body layer 6 is formed. Here, the first piezoelectric body layer 6 is formed, for example, by forming a precursor layer of the piezoelectric body using the sol-gel method, and by firing and crystallizing the precursor layer. In addition, the precursor layer may be repeatedly formed, and then, the plurality of precursor layers may be collectively fired.

[4] Intermediate Layer Forming Process S40

FIG. 14 is a view describing the intermediate layer forming process illustrated in FIG. 10.

Next, as illustrated in FIG. 14, on the first piezoelectric body layer 6, the intermediate layer 7 is formed. Here, the intermediate layer 7 is formed, for example, using the sputtering method.

[5] Second Piezoelectric Body Layer Forming Process S50

FIG. 15 is a view describing the second piezoelectric body layer forming process illustrated in FIG. 10.

Next, as illustrated in FIG. 15, on the intermediate layer 7, the second piezoelectric body layer 8 is formed. Here, similar to the forming of the first piezoelectric body layer 6, the second piezoelectric body layer 8 is formed, for example, by forming the precursor layer of the piezoelectric body using the sol-gel method, and by firing and crystallizing the precursor layer. However, in the process, by repeating the forming and the firing of the precursor layer plural times, the second piezoelectric body layer 8 having a desirable thickness is formed. In other words, in order to form each of the layers 81 to 83, the forming and the firing of the precursor layer are performed.

[6] Second Electrode Forming Process S60

Figure 16:
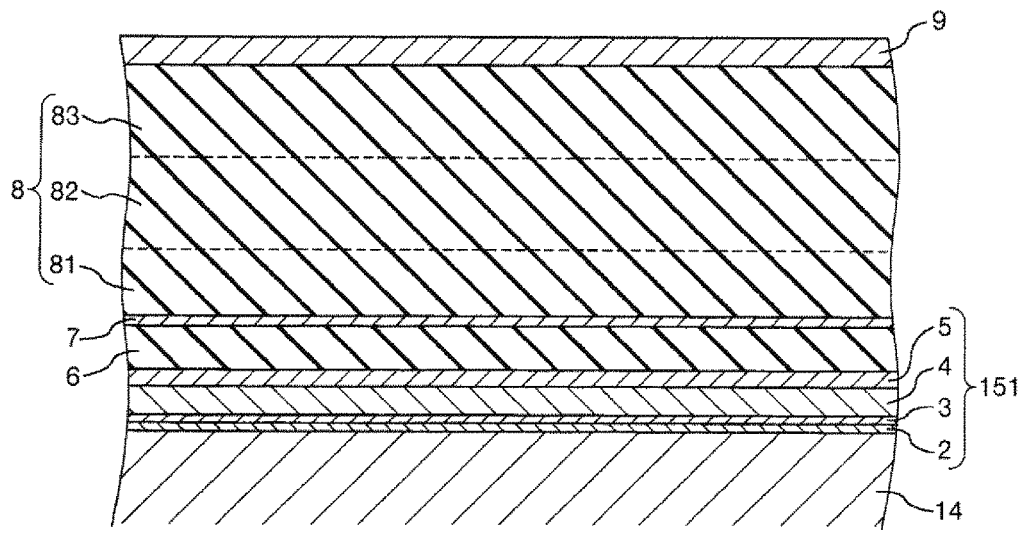
FIG. 16 is a view describing a second electrode forming process illustrated in FIG. 10.

FIG. 16 is a view describing the second electrode forming process illustrated in FIG. 10.

Next, as illustrated in FIG. 16, on the second piezoelectric body layer 8, the iridium layer 9 is formed. Here, the iridium layer 9 is formed, for example, by the sputtering method.

[7] Patterning Process S70

Figure 17:
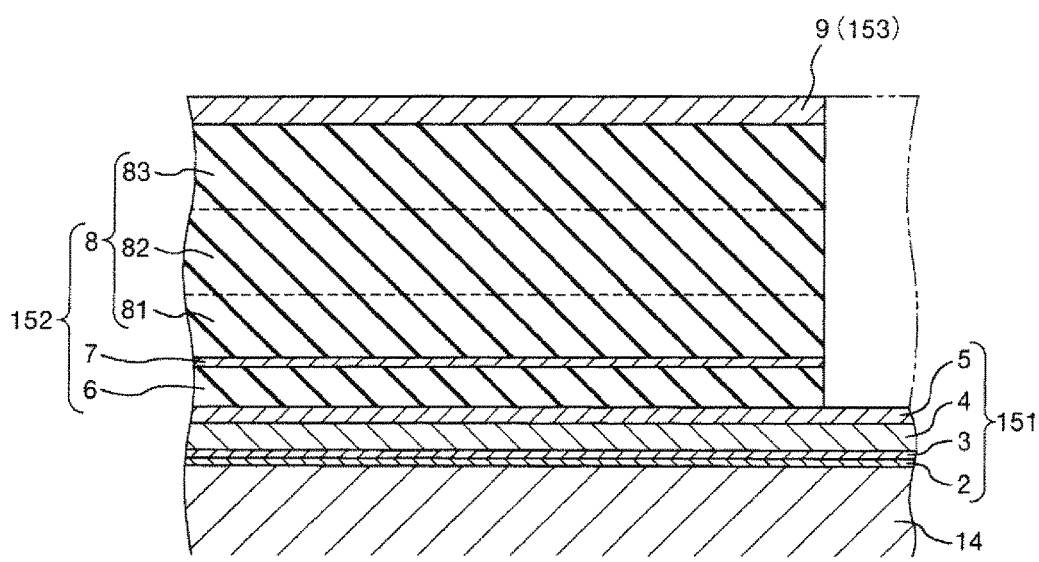
FIG. 17 is a view describing a patterning process illustrated in FIG. 10.

FIG. 17 is a view describing the patterning process illustrated in FIG. 10.

Lastly, as illustrated in FIG. 17, by collectively patterning the first piezoelectric body layer 6, the intermediate layer 7, the second piezoelectric body layer 8, and the iridium layer 9, the piezoelectric body layer 152 and the second electrode 153 are formed. Here, the patterning is performed, for example, by forming a mask using a photoresist method, and by performing dry-etching via the mask.

According to the process above, the piezoelectric element 15 can be obtained.

2. Piezoelectric Motor

Next, an embodiment of a piezoelectric motor according to the invention will be described.

Figure 18:
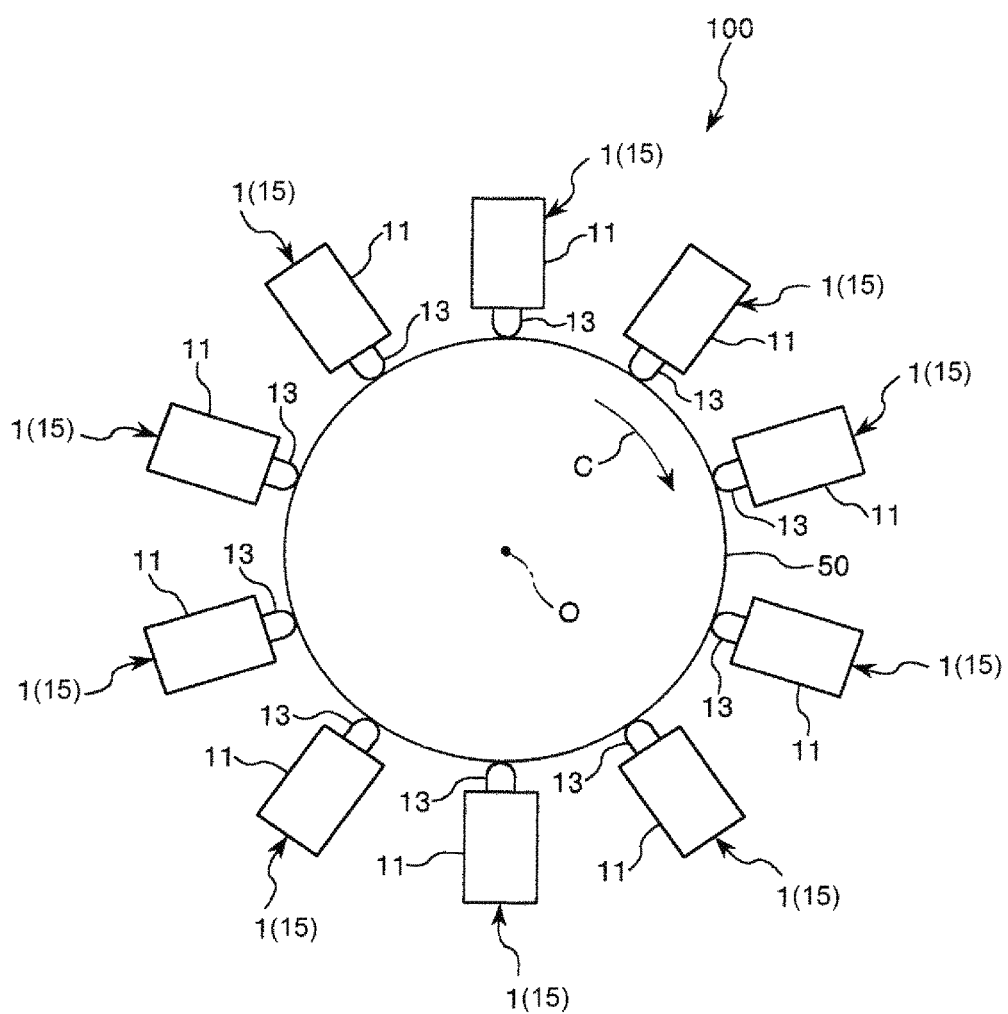
FIG. 18 is a schematic view illustrating an embodiment of a piezoelectric motor according to the invention.

FIG. 18 is a schematic view illustrating the embodiment of the piezoelectric motor according to the invention.

A piezoelectric motor 100 illustrated in FIG. 18 includes a rotor 50 which is a driven portion that can rotate around a rotating shaft O, and the plurality of piezoelectric actuators 1 which are disposed to be aligned along an outer circumferential surface of the rotor 50.

In the piezoelectric motor 100, by driving (vibrating) each of the plurality of piezoelectric actuators 1, the rotor 50 is rotated in a direction illustrated by an arrow C in FIG. 18 around the rotating shaft O.

Since the piezoelectric motor 100 described above includes the piezoelectric element 15 that achieves the above-described effects, it is possible to increase the driving force of the piezoelectric element 15.

3. Robot

Figure 19:
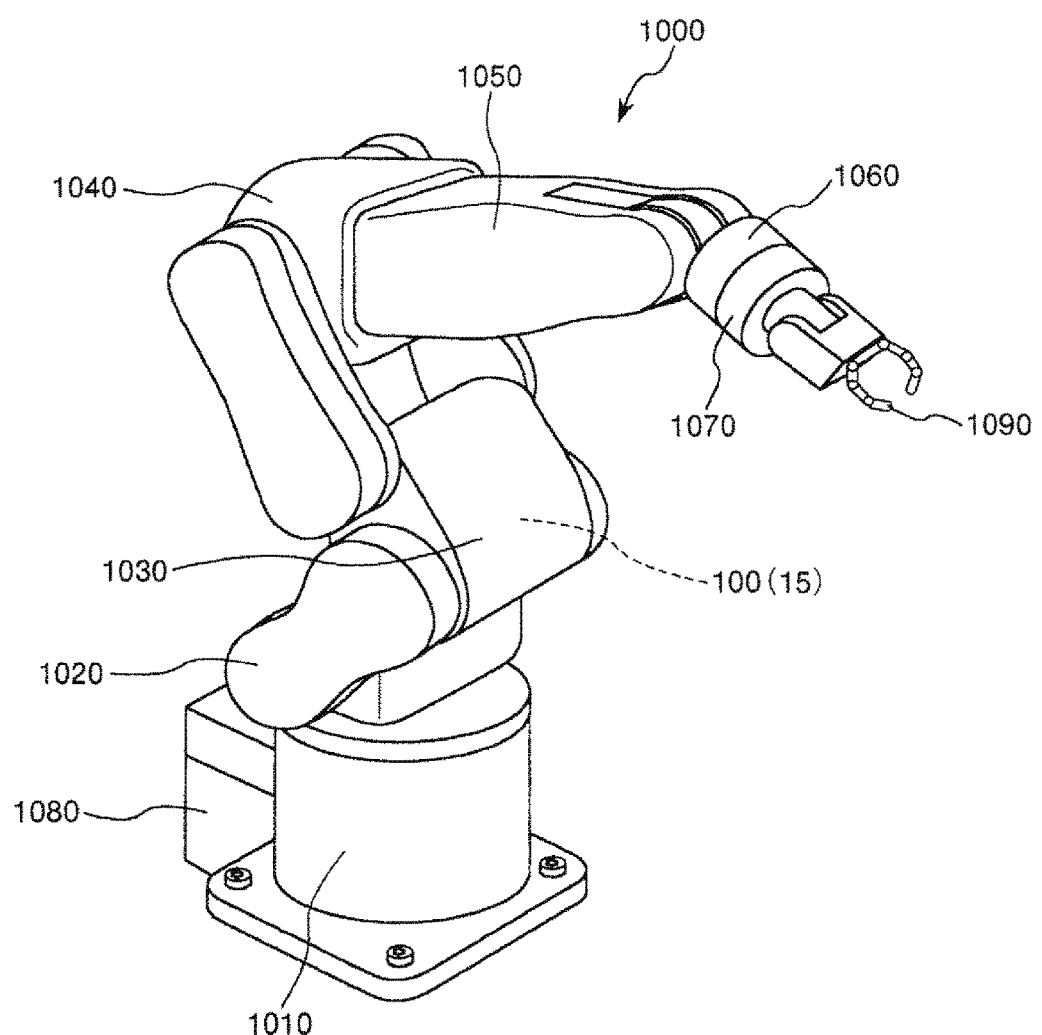
FIG. 19 is a perspective view illustrating an embodiment of a robot according to the invention.

FIG. 19 is a perspective view illustrating an embodiment of a robot according to the invention.

A robot 1000 illustrated in FIG. 19 can perform work, such as supply, remove, transport, and assembly, of precision equipment or components (target objects) that configure the equipment. The robot 1000 is a 6-axis robot, and includes a base 1010 fixed to a floor or a ceiling, an arm 1020 which is linked to the base 1010 to be freely rotatable, an arm 1030 which is linked to the arm 1020 to be freely rotatable, an arm 1040 which is linked to the arm 1030 to be freely rotatable, an arm 1050 which is linked to the arm 1040 to be freely rotatable, an arm 1060 which is linked to the arm 1050 to be freely rotatable, an arm 1070 which is linked to the arm 1060 to be freely rotatable, and a control portion 1080 which controls the driving of the arms 1020, 1030, 1040, 1050, 1060, and 1070. In addition, a hand connection portion is provided in the arm 1070, and an end effector 1090 that corresponds to the work of executing the robot 1000 is mounted on the hand connection portion. In addition, the piezoelectric motor 100 (piezoelectric actuator 1) is loaded on the entire or a part of each of joint portions, and each of the arms 1020, 1030, 1040, 1050, 1060, and 1070 rotates by the driving of the piezoelectric motor 100. In addition, the driving of each of the piezoelectric motors 100 is controlled by the control portion 1080.

Since the above-described robot 1000 includes the piezoelectric element 15 that can achieve the above-described effects, it is possible to increase the driving force of the piezoelectric element 15.

4. Electronic Component Transporting Apparatus

Figure 20:
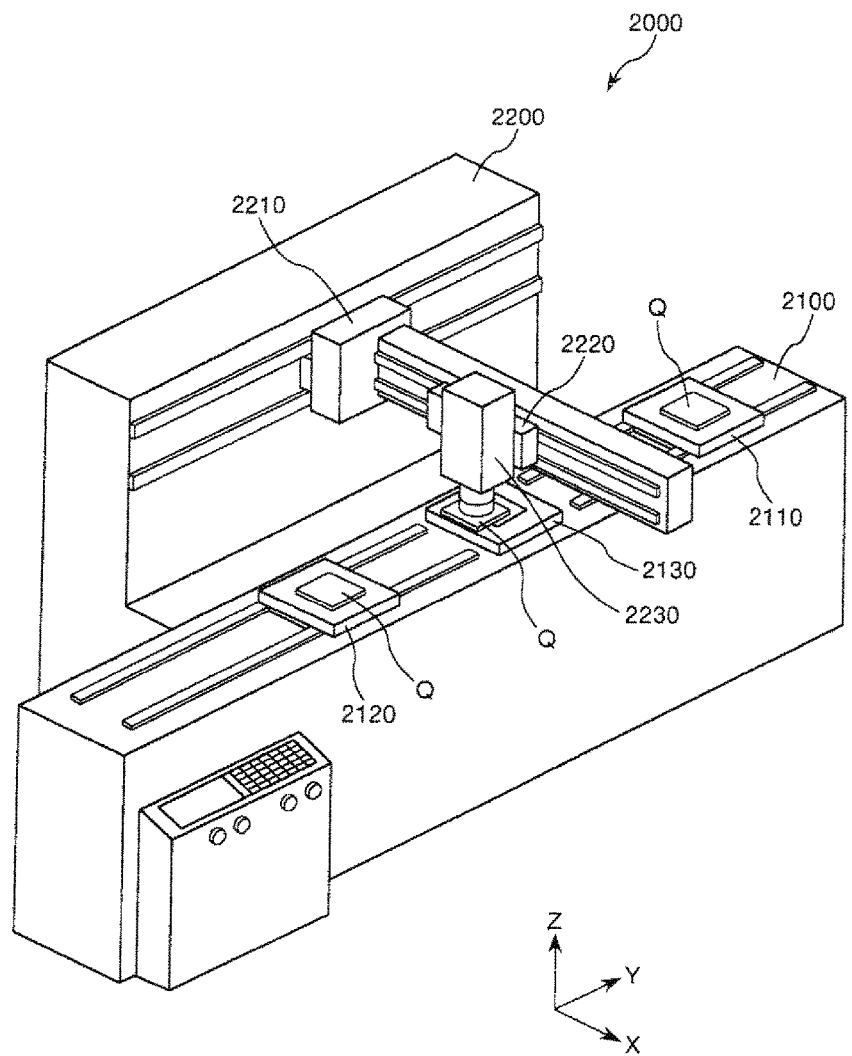
FIG. 20 is a perspective view illustrating an embodiment of an electronic component transporting apparatus according to the invention.
Figure 21:
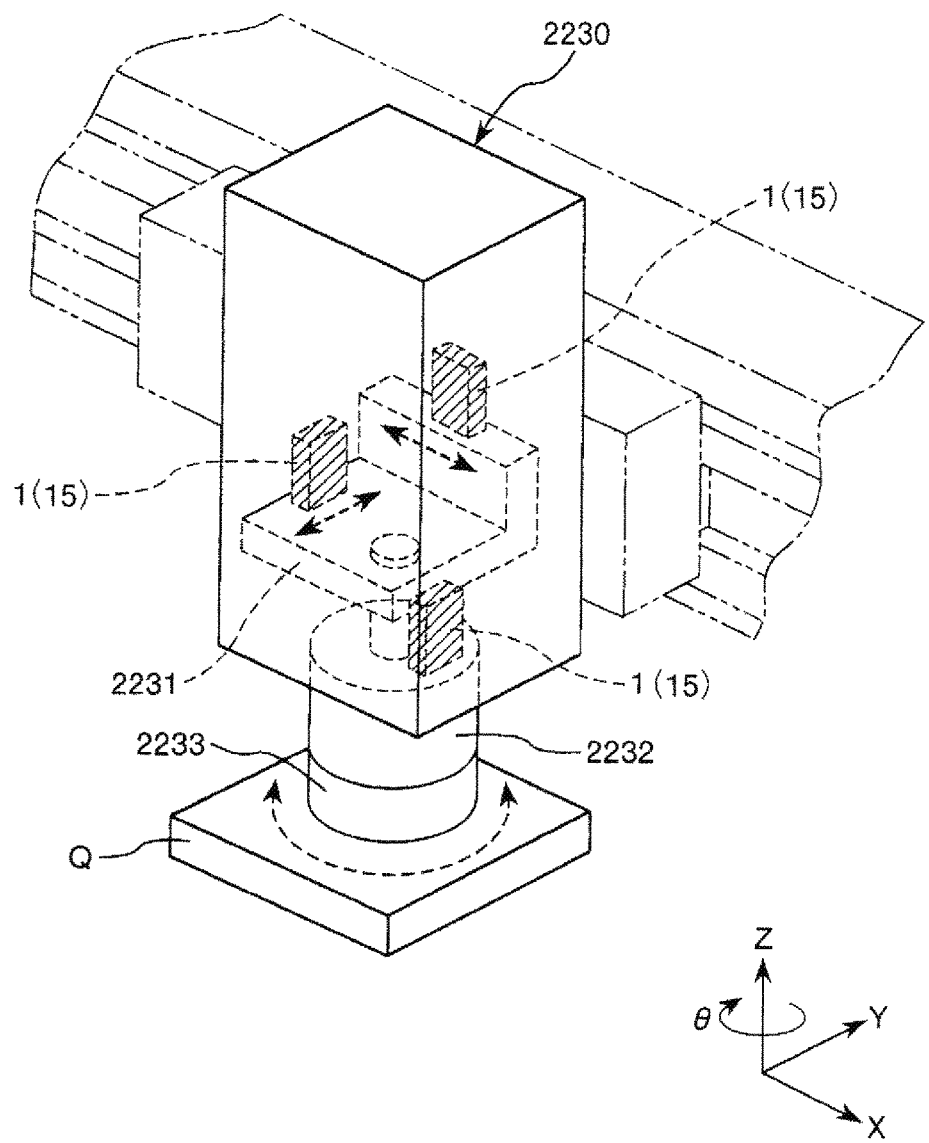
FIG. 21 is a perspective view of an electronic component holding portion of the electronic component transporting apparatus illustrated in FIG. 20.

FIG. 20 is a perspective view illustrating an embodiment of an electronic component transporting apparatus according to the invention. FIG. 21 is a perspective view of an electronic component holding portion of the electronic component transporting apparatus illustrated in FIG. 20.

An electronic component transporting apparatus 2000 illustrated in FIG. 20 is employed in an electronic component inspection apparatus, and includes a base 2100, and a support table 2200 disposed on a side of the base 2100. In addition, on the base 2100, an upstream side stage 2110 on which an electronic component Q which is an inspection target is loaded and transported in a Y-axis direction, a downstream side stage 2120 on which the electronic component Q which is already inspected is loaded and transported in the Y-axis direction, and an inspection table 2130 which is positioned between the upstream side stage 2110 and the downstream side stage 2120 and inspects electric characteristics of the electronic component Q are provided.

In addition, examples of the electronic component Q include a semiconductor, a semiconductor wafer, a display device, such as CLD or OLED, a crystal device, various sensors, ink jet head, or various MEMS devices.

In addition, a Y stage 2210 which can move in the Y-axis direction with respect to the support table 2200 is provided on the support table 2200, an X stage 2220 which can move in an X-axis direction with respect to the Y stage 2210 is provided on the Y stage 2210, and an electronic component holding portion 2230 which can move in a Z-axis direction with respect to the X stage 2220 is provided on the X stage 2220. In addition, as illustrated in FIG. 21, the electronic component holding portion 2230 includes a fine adjustment plate 2231 which can move in the X-axis direction and in the Y-axis direction, a rotation portion 2232 which can rotate around a Z axis with respect to the fine adjustment plate 2231, and a holding portion 2233 which is provided in the rotation portion 2232 and holds the electronic component Q.

In addition, in the electronic component holding portion 2230, the piezoelectric actuator 1 for moving the fine adjustment plate 2231 in the X-axis direction, the piezoelectric actuator 1 for moving the fine adjustment plate 2231 in the Y-axis direction, and the piezoelectric actuator 1 for moving the rotation portion 2232 around the Z axis, are embedded.

Since the above-described electronic component transporting apparatus 2000 includes the piezoelectric element 15 that achieves the above-described effects, it is possible to increase the driving force of the piezoelectric element 15.

5. Printer

Figure 22:
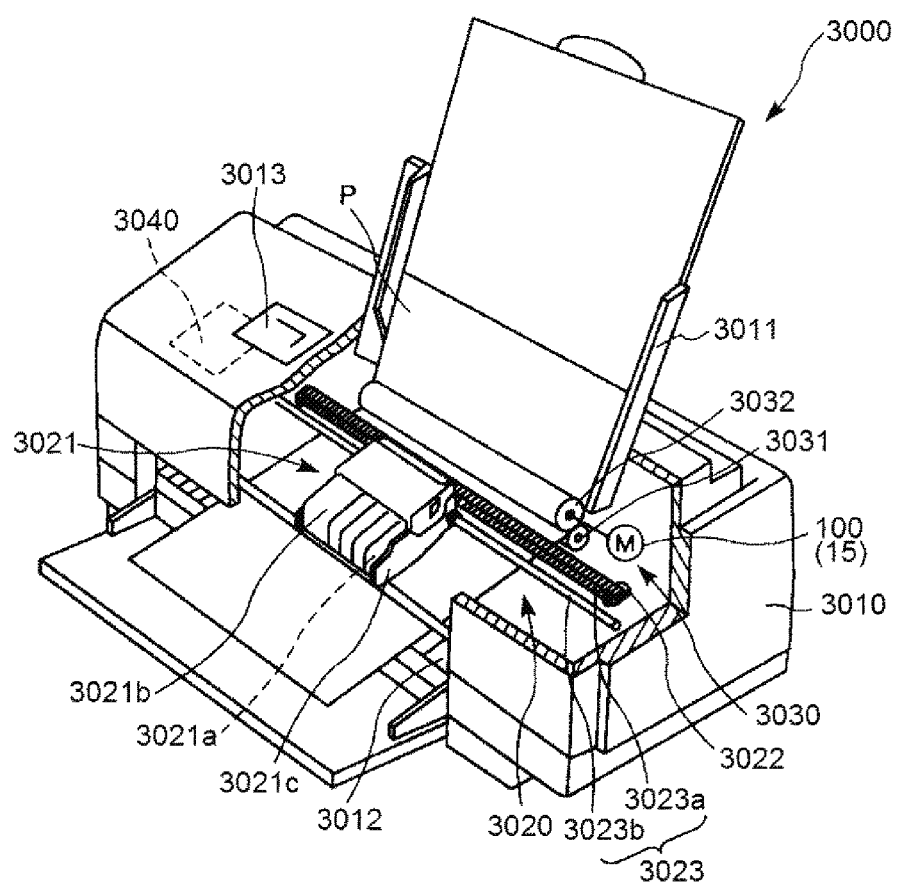
FIG. 22 is a view illustrating an embodiment of a printer according to the invention.

FIG. 22 is a view illustrating an embodiment of a printer according to the invention.

A printer 3000 illustrated in FIG. 22 is an ink jet recording type printer. The printer 3000 includes an apparatus main body 3010, a printing mechanism 3020 provided on the inside of the apparatus main body 3010, a paper supply mechanism 3030, and a control portion 3040.

In the apparatus main body 3010, a tray 3011 on which a recording paper sheet P is installed, a paper discharge port 3012 which discharges the recording paper sheet P, and an operation panel 3013, such as a liquid crystal display, are provided.

The printing mechanism 3020 includes a head unit 3021, a carriage motor 3022, and a reciprocating mechanism 3023 which reciprocates the head unit 3021 by the driving force of the carriage motor 3022. The head unit 3021 includes a head 3021a which is an inkjet type recording head, an ink cartridge 3021b which supplies ink to the head 3021a, and a carriage 3021c on which the head 3021a and the ink cartridge 3021b are loaded. The reciprocating mechanism 3023 includes a carriage guide shaft 3023a which supports the carriage 3021c to be capable of reciprocating, and a timing belt 3023b which moves the carriage 3021c on the carriage guide shaft 3023a by the driving force of the carriage motor 3022.

The paper supply mechanism 3030 includes a driven roller 3031 and a driving roller 3032 which are pressure-welded to each other, and the piezoelectric motor 100 (piezoelectric actuator 1) which is a paper supply motor that drives the driving roller 3032.

The control portion 3040 controls the printing mechanism 3020 or the paper supply mechanism 3030 based on printing data input from a host computer, such as a personal computer.

In the printer 3000, the paper supply mechanism 3030 intermittently feeds the recording paper sheet P in the vicinity of a lower portion of the head unit 3021 one by one. At this time, the head unit 3021 reciprocates in a direction which is substantially orthogonal to a feeding direction of the recording paper sheet P, and the printing onto the recording paper sheet P is performed.

Since the above-described printer 3000 includes the piezoelectric element 15 that achieves the above-described effects, it is possible to increase the driving force of the piezoelectric element 15.

Above, the piezoelectric element, the piezoelectric actuator, the piezoelectric motor, the robot, the electronic component transporting apparatus, and the printer according to the invention are described based on the embodiments of the drawings, but the invention is not limited thereto, and the configuration of each portion can be changed to an arbitrary configuration having a similar function. In addition, other arbitrary configuration objects may be added to the invention. In addition, each of the embodiments may be appropriately combined with each other.

The entire disclosure of Japanese Patent Application No. 2016-170175, filed Aug. 31, 2016 is expressly incorporated by reference herein.

What is claimed is:

1. A piezoelectric element comprising:
   a substrate;
   a first electrode which is disposed above the substrate;
   a piezoelectric body layer which is disposed above the first electrode, which has a plurality of layers configured to contain a piezoelectric body material, and in which the total thickness of the plurality of layers is within a range of 1.6 μm to 10 μm; and
   an intermediate layer which is disposed on an interlayer of the piezoelectric body layer, and which is configured to contain titanium.

2. The piezoelectric element according to claim 1,
   wherein the thickness of the intermediate layer is within a range of 2 nm to 6 nm.

3. A piezoelectric actuator comprising:
   the piezoelectric element according to claim 2.

4. A piezoelectric motor comprising:
   the piezoelectric element according to claim 2.

5. A robot comprising:
   the piezoelectric element according to claim 2.

6. An electronic component transporting apparatus comprising:
   the piezoelectric element according to claim 2.

7. A printer comprising:
   the piezoelectric element according to claim 2.

8. The piezoelectric element according to claim 1,
   wherein the intermediate layer is disposed on an interlayer positioned closest to the first electrode side among the interlayers of the plurality of layers of the piezoelectric body layer.

9. The piezoelectric element according to claim 8,
   wherein the thickness of the layer positioned closest to the first electrode side among the plurality of layers of the piezoelectric body layer is within a range of 60 nm to 160 nm.

10. A piezoelectric actuator comprising:
    the piezoelectric element according to claim 8.

11. A piezoelectric motor comprising:
    the piezoelectric element according to claim 8.

12. A robot comprising:
    the piezoelectric element according to claim 8.

13. An electronic component transporting apparatus comprising:
    the piezoelectric element according to claim 8.

14. A printer comprising:
    the piezoelectric element according to claim 8.

15. The piezoelectric element according to claim 1,
    wherein the piezoelectric body material is lead zirconate titanate.

16. A piezoelectric actuator comprising:
    the piezoelectric element according to claim 1.

17. A piezoelectric motor comprising:
    the piezoelectric element according to claim 1.

18. A robot comprising:
    the piezoelectric element according to claim 1.

19. An electronic component transporting apparatus comprising:
    the piezoelectric element according to claim 1.

20. A printer comprising:
    the piezoelectric element according to claim 1.

* * * * *